US012635730B2

(12) United States Patent　　　　　　　　(10) Patent No.:　US 12,635,730 B2
Monticone　　　　　　　　　　　　　　　　　(45) Date of Patent:　　May 26, 2026

(54) AEROSOL GENERATING DEVICE

(71) Applicant: JT International SA, Geneva (CH)

(72) Inventor: Pier Paolo Monticone, Le Grand
　　　　　　　Saconnex (CH)

(73) Assignee: JT International SA, Geneva (CH)

( * ) Notice: 　Subject to any disclaimer, the term of this
　　　　　　　patent is extended or adjusted under 35
　　　　　　　U.S.C. 154(b) by 222 days.

(21) Appl. No.: 17/641,656

(22) PCT Filed: 　Sep. 7, 2020

(86) PCT No.: 　PCT/EP2020/074928
　　　§ 371 (c)(1),
　　　(2) Date: 　Mar. 9, 2022

(87) PCT Pub. No.: WO2021/048047
　　　PCT Pub. Date: Mar. 18, 2021

(65) 　　　　Prior Publication Data
　　　US 2022/0304385 A1　　Sep. 29, 2022

(30) 　　Foreign Application Priority Data
　　Sep. 10, 2019　(EP) ..................................... 19196568

(51) Int. Cl.
　　　*A24F 40/46*　　　　　(2020.01)
　　　*A24F 40/20*　　　　　(2020.01)
　　　　　　(Continued)
(52) U.S. Cl.
　　　CPC .............. *A24F 40/46* (2020.01); *A24F 40/20*
　　　　　(2020.01); *A24F 40/51* (2020.01); *A24F 40/57*
　　　　　　(2020.01); *G05D 23/192* (2013.01); *H10N*
　　　　　　　　　　　　　　　　　*10/13* (2023.02)
(58) Field of Classification Search
　　　None
　　　See application file for complete search history.

(56) 　　　　References Cited

U.S. PATENT DOCUMENTS 5,529,078 A 　　6/1996　Rehder et al.
2005/0284337 A1* 12/2005 Shigematsu ......... C09D 167/00
　　　　　　　　　　　　　　　　　　427/372.2
　　　　　　　(Continued)

FOREIGN PATENT DOCUMENTS

CN 　　　101216227 A 　　7/2008
CN 　　　208228318 U 　　12/2018
　　　　　　　(Continued)

OTHER PUBLICATIONS

KR 101039837 B1, English Translation obtained from Espacenet,
pp. 1-15 (Year: 2024).*

(Continued)

*Primary Examiner* — Philip Y Louie
*Assistant Examiner* — John Mitchell Martin
(74) *Attorney, Agent, or Firm* — Lerner David LLP

(57) 　　　　　ABSTRACT

An aerosol generating device includes a heating chamber;
and a thermoelectric cell. The aerosol generating device is
configured to supply electrical power to the thermoelectrical
cell and the thermoelectric cell is arranged such that, when
electrical power is supplied to the thermoelectric cell, heat
is transferred through the thermoelectrical cell to the heating
chamber by the thermoelectrical cell. A control unit is
configured to control the heat transferred by the thermoelec-
trical cell so as to regulate an internal temperature of the
heating chamber. A method of controlling the aerosol gen-
erating device includes controlling the heat transferred
through the thermoelectric cell so as to regulate the internal
temperature of the heating chamber.

16 Claims, 2 Drawing Sheets

(51) Int. Cl.

| | | |
|---|---|---|
| *A24F 40/51* | (2020.01) |
| *A24F 40/57* | (2020.01) |
| *G05D 23/19* | (2006.01) |
| *H10N 10/13* | (2023.01) |

(56) References Cited

U.S. PATENT DOCUMENTS

| | | | |
|---|---|---|---|
| 2007/0283971 A1 | 12/2007 | Gidding | |
| 2014/0360515 A1 | 12/2014 | Vasiliev et al. | |
| 2018/0103686 A1* | 4/2018 | Monsees | A61M 11/042 |
| 2018/0153208 A1 | 6/2018 | Schaller et al. | |
| 2019/0150512 A1 | 5/2019 | Furudono | |
| 2019/0150516 A1 | 5/2019 | Shenkal et al. | |
| 2019/0174833 A1 | 6/2019 | Shuster et al. | |
| 2022/0183367 A1* | 6/2022 | Moloney | A24F 40/70 |

FOREIGN PATENT DOCUMENTS

| | | | | |
|---|---|---|---|---|
| CN | 109123797 | A | | 1/2019 |
| CN | 110307667 | A | | 10/2019 |
| JP | 2014518095 | A | | 7/2014 |
| KR | 101039837 | B1 | * | 6/2011 |
| KR | 20190038183 | A | * | 4/2019 |
| WO | 2018016030 | A1 | | 1/2018 |
| WO | 2019115464 | A1 | | 6/2019 |
| WO | 2019115475 | A1 | | 6/2019 |

OTHER PUBLICATIONS

KR 20190038183 A, English Translation obtained from Espacenet, pp. 1-21 (Year: 2024).*

International Search Report for Application No. PCT/EP2020/074928 mailed Dec. 16, 2020, pp. 1-5.

Search Report dated Mar. 18, 2024 from Office Action for Chinese Application No. 2020800634975 issued Mar. 20, 2024. 2 pgs.

* cited by examiner

AEROSOL GENERATING DEVICE

CROSS-REFERENCE TO RELATED APPLICATIONS

The present application is a national phase entry under 35 U.S.C. § 371 of International Application No. PCT/EP2020/074928, filed Sep. 7, 2020, published in English, which claims priority from European Application No. 19196568.0 filed Sep. 10, 2019, the disclosures of all of which are incorporated herein by reference.

FIELD

The present disclosure relates to an aerosol generation device. The disclosure is particularly applicable to a portable aerosol generation device, which may be self-contained and low temperature. Such devices may heat, rather than burn, tobacco or other suitable aerosol substrate materials by conduction, convection, and/or radiation, to generate an aerosol for inhalation. Devices in accordance with the invention are safer, more reliable and more compact.

SUMMARY OF INVENTION

The popularity and use of reduced-risk or modified-risk devices (also known as vaporisers) has grown rapidly in the past few years as an aid to assist habitual smokers wishing to quit smoking traditional tobacco products such as cigarettes, cigars, cigarillos, and rolling tobacco. Various devices and systems are available that heat or warm aerosolisable substances as opposed to burning tobacco in conventional tobacco products.

A commonly available reduced-risk or modified-risk device is the heated substrate aerosol generation device or heat-not-burn device. Devices of this type generate an aerosol or vapour by heating an aerosol substrate that typically comprises moist leaf tobacco or other suitable aerosolisable material to a temperature typically in the range 150° C. to 350° C. Heating an aerosol substrate, but not combusting or burning it, releases an aerosol that comprises the components sought by the user but not the toxic and carcinogenic by-products of combustion and burning. Furthermore, the aerosol produced by heating the tobacco or other aerosolisable material does not typically comprise the burnt or bitter taste resulting from combustion and burning that can be unpleasant for the user and so the substrate does not therefore require the sugars and other additives that are typically added to such materials to make the smoke and/or vapour more palatable for the user.

Known aerosol generating devices typically include a heating chamber for receiving a consumable aerosol generating substrate, a power source and control circuitry for controlling the supply of power to the heating chamber from the power source. One known issue with such devices is that the inevitable proximity of the heating chamber to the power source and control circuitry within the device can cause unwanted heating of the power source and electronic circuitry. This heating may damage these heat-sensitive electronic components and can degrade performance due to thermal aging. Furthermore, in extreme cases there is a risk of fire or explosion when components that are not designed to be heated become too hot.

There is also an increasing motivation to provide more compact, user friendly aerosol generating devices. However, reducing the size of such devices inevitably brings the delicate electronic components into closer proximity with the heat source and exacerbates the heat management issues described above. Conventionally layers of thermal insulation are provided around the heating chambers of these devices so as to restrict the dissipation of heat from the heating chamber. Indeed, sufficient thermal insulation must be provided to ensure that all surfaces by which the device may be held by a user are kept at appropriate temperatures so that the devices are safe to handle. Moreover, thicker layers of thermal insulation will be seen to increase the efficiency of a device since heat lost as it dissipates away from a heating chamber is reduced. Hence there are incentives to provide thicker layers of thermal insulation. However, the thick layers of insulation necessary to protect devices and their users constrain the volume of an aerosol generating device and limit how small such a device may be made.

It is an object of the present invention to address the above issues and to provide a compact aerosol generating device with improved safety and/or reliability.

SUMMARY

According to a first aspect of the invention there is provided an aerosol generating device comprising a heating chamber; a heating chamber; and a thermoelectric cell; wherein the aerosol generating device is configured to supply electrical power to the thermoelectrical cell and the thermoelectric cell is arranged such that, when electrical power is supplied to the thermoelectric cell, heat is transferred through the thermoelectrical cell to the heating chamber by the thermoelectrical cell.

A "thermoelectrical cell" is a device configured to transfer heat through it when supplied with an electrical voltage due to the Peltier effect. Such a thermoelectrical cell may also generate an electrical voltage when different surfaces of the device are at different temperatures under the Seebeck effect, although this effect is not required to achieve the advantages discussed below. Thermoelectrical cells may comprise a thermocouple (two dissimilar electrical conductors formed in an electrical junction) or pillars of two semiconductors, one an n-type semiconductor and the other a p-type semiconductors, the pillars being electrically arranged in parallel. Thermoelectrical cells suitable for use in the invention include those comprising Bismuth Telluride, Lead Telluride, Silicon-Germanium, and Bismuth-Antimony (Bi—Sb).

The thermoelectrical cells in devices according to the invention can be seen to transfer heat to actively counteract the dissipation of heat away from the heating chamber of an aerosol generating device, reducing the net flow of heat away from the heating chamber. The claimed "active" devices may be contrasted with the "passive" action of thermal insulation present in conventional devices, in which the thermal insulation merely restricts the passage of heat therethrough due to its low thermal conductivity.

Aerosol generating devices, and especially heat-not-burn devices, according to the invention offer significant advantages.

Firstly, the thermoelectrical cell is configured to supply heat into the heating chamber (also commonly termed an oven). Thus the thermoelectrical cell may increase the net flow of heat into the heating chamber, and may counteract and/or prevent the dissipation or flow of heat away from the heating chamber during use—i.e. when an aerosol substrate is heated in the heating chamber to release an aerosol. By reducing or preventing the net flow of heat away from the heating chamber during use, the safety and reliability of the aerosol generating device is increased. In particular, less heat will reach other components of the aerosol generating device and the impact of thermal aging on these components may be significantly reduced.

In addition, the thermoelectrical cell may be used in place of, or in addition, to the layer of thermal insulation within a conventional aerosol generating device. Hence, it will be appreciated that the passive management of heat using a layer of thermal insulation may be replaced or supplemented by the "active" thermal insulation provided by the thermo-electric cell. In other words, unlike conventional devices, an aerosol generating device according to the invention may not comprise a layer of thermal insulation. By avoiding a layer of thermal insulation, or reducing the size of such a layer, the aerosol generating device may be made more compact.

Moreover, since the thermoelectrical cell supplies heat to the heating chamber, it may be used in place of, or reduce the requirements of, a heater within the aerosol generating device. This may allow the size of the heater to be reduced and the size of the aerosol generating device to be reduced. Moreover, the lifespan and reliability of any heater may be increased.

Equally, since heat is actively prevented from dissipating away from the heating chamber within the aerosol device the device may be made particularly energy efficient. The requirements for a power source may be reduced. For instance, a power source such as a battery may be designed smaller and/or may provide greater lifespan.

Therefore, aerosol generating devices in accordance with the invention are safer, more reliable, more energy efficient and more compact.

The aerosol generation device could in some embodiments be referred to as a "heated tobacco device", a "heat-not-burn tobacco device", a "device for vaporising tobacco products", and the like, with this being interpreted as a device suitable for achieving these effects. The features disclosed herein are equally applicable to devices which are designed to vaporise any aerosol substrate.

A heating chamber as discussed herein is configured to receive an aerosol substrate, and is configured to be heated to a temperature at which said aerosol substrate releases or produces an aerosol. For instance, the heating chamber may be arranged to receive the aerosol substrate in a pre-pack-aged substrate carrier. The substrate carrier may broadly resemble a cigarette, having a tubular region with an aerosol substrate arranged in a suitable manner. Filters, vapour collection regions, cooling regions, and other structure may also be included in some designs. An outer layer of paper or other flexible planar material such as foil may also be provided, for example to hold the aerosol substrate in place, to further the resemblance of a cigarette, etc. The substrate carrier may fit within the heating chamber or may be longer than the heating chamber such that the substrate carrier protrudes from the aerosol generating device when fitted within the heating chamber. In such embodiments, the aerosol may be provided directly from the substrate carrier which acts as a mouthpiece for the aerosol generating device.

The thermoelectric cell may comprise a heat receiving surface and a heat emitting surface, wherein when electrical power is supplied to the thermoelectric cell heat is transferred from the heat receiving surface to the heat emitting surface. The thermoelectrical cell is preferably arranged such that the heat emitting surface is provided between the heat receiving surface and the heating chamber. Therefore, heat transferred by the thermoelectrical cell is conveyed towards the heating chamber by the thermoelectrical cell.

As mentioned above, the active transfer of heat through the thermoelectrical cell in response to a supply of energy will be contrary to any diffusion or dissipation of heat away from the hot heating chamber during use. In other words, the thermoelectrical cell may be seen to reduce the net flow of heat from the heat emitting surface to the heat receiving surface. In particularly preferred examples the thermoelectrical cell may transfer sufficient heat so as to entirely counteract the dissipation of heat through the thermoelectrical cell during use, such that there is no net flow or heat or a net flow of heat from the heat receiving surface to the heat emitting surface and into the heating chamber.

Preferably the heat emitting surface is arranged in contact with, or forms at least part of, a wall of the heating chamber. In other words, the heat emitting surface may be formed adjacent to, or define the boundary, of the heating chamber. Thus heat may be efficiently transferred from the thermo-electrical cell to the heating chamber.

Preferably the heat emitting surface conforms to the surface relief of at least one wall of the heating chamber. This again allows for heat to be efficiently transferred from the thermoelectrical cell to the heating chamber. Preferably the thermoelectrical cell is configured to surround the heat-ing chamber.

In some examples the thermoelectrical cell may be flex-ible, such that the thermoelectrical cell may be made to conform to the shape of at least one wall during assembly of the aerosol generating device. Alternatively, the thermoelec-trical cell may be manufactured to match or correspond to the desired form of the thermoelectrical cell.

Preferably the heating chamber is cylindrical and the heat emitting surface extends circumferentially around the heat-ing chamber. For example, the thermoelectrical cell may extend around the whole circumference of the heating chamber (i.e. such that the thermoelectrical cell is cylindri-cal, and concentrically surrounds the heating chamber) or only a portion of the circumference of the heating chamber (e.g. where the thermoelectrical cell has a semi-circular cross section).

A further advantage provided by the examples discussed above—where a thermoelectrical cell that is provided at the boundary to or in close proximity to the heating chamber and/or where a thermoelectrical cell is configured to sur-round at least part of the heating chamber—is that the heat profile and the heat distribution within the heating chamber is improved during use. For example, the temperature through the heating chamber may be made more consistent. Thus the heat applied to an aerosol substrate may also be improved—e.g. by making the heating of the aerosol sub-strate more consistent. This may improve the consistency and flavour of the aerosol generated by the aerosol gener-ating device and maximise the amount of aerosol produced from each consumable aerosol substrate thereby increasing the lifespan of a given consumable aerosol substrate.

In further examples the aerosol generating device may comprise a plurality of thermoelectrical cells that each comprise any of the features discussed above and offer corresponding benefits.

Preferably the heating chamber is configured to receive a consumable aerosol generating substrate. For instance, the heating chamber may be configured to receive and heat a solid consumable aerosol generating substrate (i.e. an aero-sol substrate) such as tobacco stick. Preferably the shape of the heating chamber is configured to correspond to an aerosol substrate which it is configured to receive. This minimises the gap between the wall of the heating chamber and the cylindrical aerosol substrate and improves heat transfer to the aerosol substrate from the heating chamber. The cylindrical heating chambers discussed above are particular well suited to receive and heat cylindrical aerosol substrates such as tobacco sticks. However, this is not essential and the heating chamber and consumable may take other forms—e.g. the consumable may be in the form of a SIM card or pod, and/or the heating chamber may be substantially rectangular in cross section.

Preferably the aerosol generating device comprises a control unit configured to regulate the heat transferred by the thermoelectrical cell so as to control the internal temperature of the heating chamber. In some examples the control unit is configured to apply a closed loop control method. Using such a method the control unit may maintain the internal temperature of the heating chamber at a predetermined temperature. However, in particularly preferred examples the control unit may control the internal temperature of the heating chamber such that the internal temperature is varied over time and/or during use. For instance the control unit may be configured to increase the internal temperature of the heating chamber as a given aerosol substrate is used. This may compensate for flavor depletion of the aerosol substrate through use. As such the aerosol generated by the device may be made more consistent. The control unit may control the electrical power supplied to the thermoelectrical cell or operational parameters of the thermoelectrical cell so as to help regulate the internal temperature of the heating chamber.

In particularly, preferred examples the control unit is configured to maintain the internal temperature of the heating chamber within the range of 150 to 350 degrees Celsius, more preferably within the range of 190 to 310 degrees Celsius, more preferably still within the range of 230 to 260 degrees Celsius. These figures are suitable for use with a wide variety of aerosol substrates, and are particularly well suited for generating an aerosol or vapour from an aerosol substrate comprising tobacco (e.g. moist leaf tobacco).

Preferably the aerosol generating device comprises a heater configured to supply heat to the heating chamber. The heater (e.g. a thin film heater and/or a resistive heater) may receive electrical power supplied by the aerosol generating device and convert said electrical power into heat.

Preferably the aerosol generating device comprises a control unit (i.e. a controller) configured to regulate the heat supplied to the heating chamber by the heater so as to control the internal temperature of the heating chamber. In particularly preferred examples the control unit may regulate the heat supplied by both the heater and the thermoelectrical cell (e.g. by varying the electrical power supplied to said components and/or the operational parameters of said components) to maintain an appropriate temperature within the heating chamber.

Preferably the aerosol generating device further comprises one or more temperature sensors, each temperature sensor being configured to measure one of: the internal temperature of the heating chamber, the temperature of a surface of the thermoelectrical cell and/or the temperature of the heater. The temperature sensor(s) may be configured to measure the temperature of the heat emitting surface and/or the heat receiving surface of the thermoelectrical cell. The temperature sensor(s) may comprise, for instance, a thermocouple or a thermistor.

Preferably the control unit is configured to receive a temperature measurement from a temperature sensor of said one or more temperature sensors and is further configured to regulate the internal temperature of the heating chamber based on said temperature measurement. Therefore, the internal temperature of heating chamber may be accurately controlled so as to increase performance, safety and reliability. Alternatively, the control unit may be configured to control the thermoelectrical cell and/or the heater based on pre-determined values, such as empirically determined values.

Preferably the aerosol generating device comprises a power source configured to supply electrical power to the thermoelectric cell. The power source may also supply electrical power to any further components of the aerosol generating device including (but not limited to) a heater and/or a control unit. Preferably the aerosol comprises an internal power source such as a battery. However, alternatively the power source may be a connector by which the aerosol may receive electrical power from an external source.

Preferably the aerosol generating device comprises an internal frame, the internal frame arranged to hold at least one of the heating chamber, thermoelectrical cell, heater and control unit within the frame. In this way, the components of the device may be held securely in position within a housing of the device. Furthermore, the provision of a frame allows the components to be held in a precise, reproducible position which assists with heat management by allowing the components to be precisely held in a position which reduces heat transfer to sensitive electronic components, such as a battery.

According to a further aspect of the invention there is provided a control unit suitable for use in an aerosol generating device according to the first aspect of the invention discussed above, wherein the control unit is configured to control the heat transferred by the thermoelectrical cell so as to regulate the internal temperature of the heating chamber. The control unit may comprise any of the optional features of the control units discussed above with reference to the first aspect of the invention and offer corresponding advantages.

For instance, the control unit may be configured to maintain the internal temperature of the heating chamber within the range of 150 to 350 degrees Celsius, more preferably within the range of 190 to 310 degrees Celsius, more preferably still within the range of 230 to 260 degrees Celsius.

Optionally, the control unit is further configured to regulate the heat supplied to the heating chamber by a heater so as to control the internal temperature of the heating chamber.

Optionally, the control unit is configured to receive a temperature measurement from one or more temperature sensors and is further configured to control the internal temperature of the heating chamber based on said temperature measurement. Said temperature sensor(s) may be configured to measure one of: the internal temperature of the heating chamber, the temperature of a surface of the thermoelectrical cell and/or the temperature of the heater.

Optionally, the control unit is configured to control the internal temperature of the heating chamber using closed loop control.

Optionally the control unit is configured to regulate: the electrical power supplied from a power source to the thermoelectrical cell and/or a heater; and/or the operational parameters of the thermoelectrical cell and/or the heater.

According to a further aspect of the invention there is provided a method of controlling an aerosol generating device according to the first aspect of the invention discussed above, the method comprising the step of controlling the heat transferred through the thermoelectrical cell so as to regulate the internal temperature of the heating chamber.

The method may be performed by a control unit as discussed with reference to either of the preceding aspects of the invention.

The method may comprise regulating the heat transferred through the thermoelectrical cell so as to maintain the internal temperature of the heating chamber within the range of 150 to 350 degrees Celsius, more preferably within the range of 190 to 310 degrees Celsius, more preferably still within the range of 230 to 260 degrees Celsius.

Optionally, the method may further comprise regulating the heat supplied to the heating chamber by a heater so as to control the internal temperature of the heating chamber.

Optionally, the method may comprise receiving a temperature measurement from one or more temperature sensors and controlling the internal temperature of the heating chamber based on said temperature measurement (e.g. by regulating the heat supplied to the heating chamber by the thermoelectrical device and/or a heat based on said temperature measurement). Said temperature sensor(s) may be configured to measure one of: the internal temperature of the heating chamber, the temperature of a surface of the thermoelectrical cell and/or the temperature of the heater.

Optionally the method may comprise regulating or modifying: the electrical power supplied from a power source to the thermoelectrical cell and/or a heater; and/or the operational parameters of the thermoelectrical cell and/or the heater.

Optionally, the method comprises controlling the internal temperature of the heating chamber using closed loop control. For instance, the method may comprise: receiving a temperature measurement (e.g. a temperature measurement from one of the temperature sensors discussed above); comparing the temperature measurement to a desired temperature (e.g. a predetermined desired temperature); and modifying the heat transferred to the heating chamber by the thermoelectrical cell and/or the heat supplied to the heating chamber by a heater based on the result of this comparison. For example if the actual temperature measured by a temperature sensor is greater than the desired temperature the heat transferred by the thermoelectrical cell and/or the heat supplied by a heater may be reduced (e.g. by modifying the power supplied to these components or by changing their operational parameters). Such a closed loop control method may improve safety and reliability. Alternatively or additionally, the method may comprise operating the heater and/or the thermoelectrical cell for a predetermined amount of time and/or at a predetermined power.

BRIEF DESCRIPTION OF DRAWINGS

Specific examples of the invention will now be discussed with reference to the following figures.

DETAILED DESCRIPTION

Figure 1A:
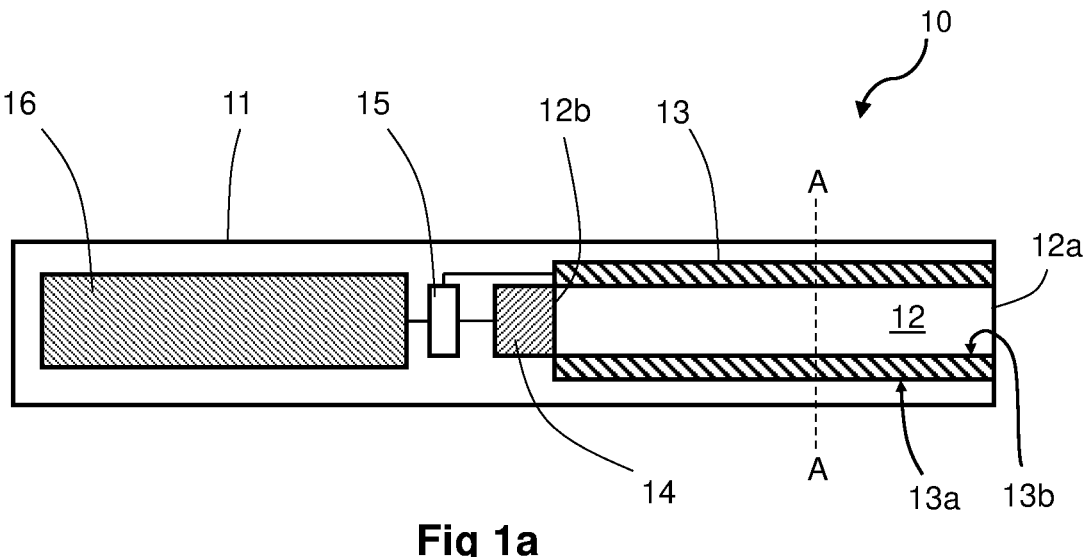
FIGS. 1a and 1b show two schematic cross sections of an aerosol generating device in accordance with the invention.
Figure 1B:
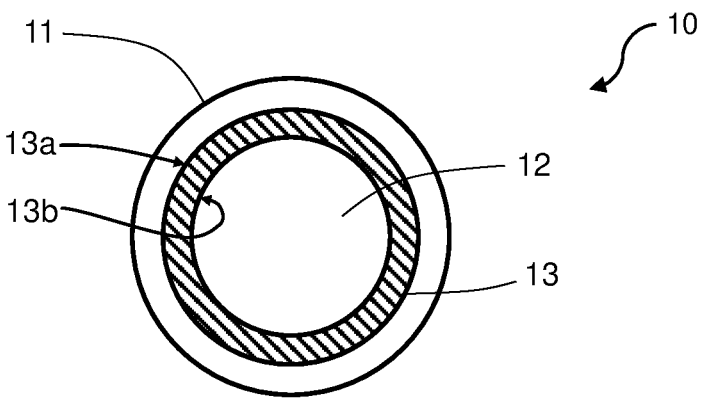
Figure 2:
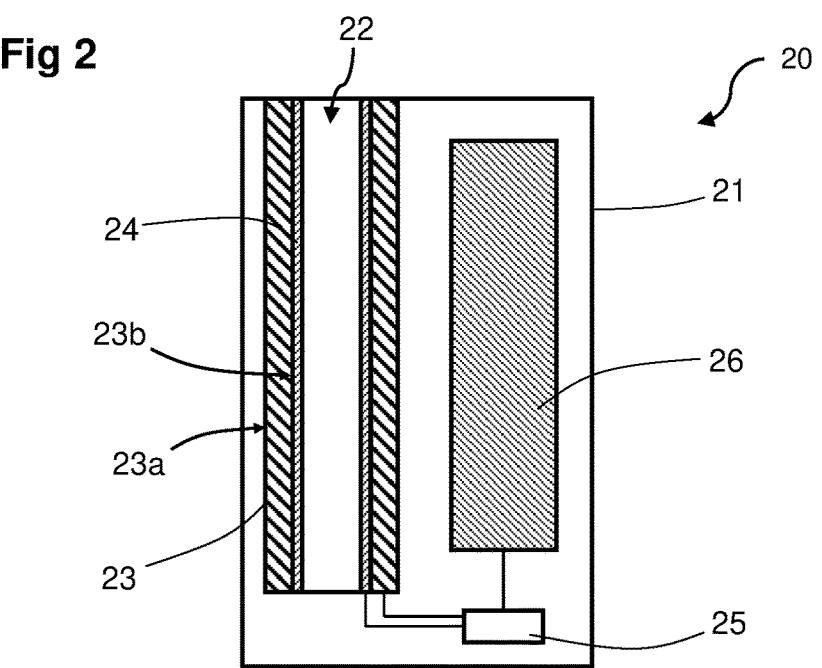
FIG. 2 shows a schematic cross section of a further aerosol generating device in accordance with the invention.

FIGS. 1a and 2 show two examples of aerosol generating devices 10, 20 in cross section along a plane parallel to the longitudinal direction in which a heating chamber 12, 22 of each aerosol generating device 10, 20 extends. FIG. 1b shows the aerosol generating devices 10 of FIG. 1a in a further cross section through line A-A that extends through a plane perpendicular to the longitudinal direction in which the heating chamber 12 extends.

Each of these aerosol generating devices 10, 20 comprises a housing 11, 21 by which the device 10 may be held. Within each housing 11, 21 is provided a heating chamber 12, 22, the heating chamber 12, 22 being configured to receive an aerosol substrate through an open end 12a, 22a—i.e. a solid consumable aerosol generating substrate that releases an aerosol when heated such as tobacco sticks. The heating chambers 12, 22 are configured to be heated to a temperature at which an aerosol is produced from the aerosol substrate (e.g. between 150 to 350 degrees Celsius for many aerosol substrates). As such the heating chambers 12, 22 act as ovens. Around each heating chamber 12, 22 is provided a cylindrical thermoelectrical cell 13, 23 (also commonly termed a Peltier cell, Peltier cooler, or thermoelectrical cooler). As such, each cylindrical thermoelectrical cell 13, 23 surrounds the respective heating chamber 12, 22, being provided concentrically around said heating chamber 12, 22. The aerosol generating devices 10, 20 each further comprise a heater 14, 24 (e.g. a resistive heater) configured to supply heat to the heating chamber 12, a control unit 15, 25 configured to regulate the internal temperature of the respective heating chamber 12, 22, and a battery 16, 26 configured to power the electrical components of respective device 10, 20. The thermoelectrical cell 13, 23, heater 14, 24, control unit 15, 25 and battery 16, 26 of each aerosol generating device 10, 20 are electrically connected as illustrated schematically by the lines between these components on FIGS. 1a and 2.

The aerosol generating device 10 shown in FIGS. 1a and 1b is elongate, being pen or stick shaped. The heating chamber 12 of this device 10 is provided substantially coaxially with a battery 16 (such that the heating chamber 12 and the battery 16 are arranged end-to-end). This arrangement reduces heat transfer from the heating chamber 12 to the remaining electrical component of the aerosol generating device 10, thereby improving reliability and safety. In contrast, the aerosol generating device 20 shown in FIG. 2 is carton shaped, having a larger aspect ratio. As shown, the aerosol generating device 20 of FIG. 2 comprises a heating chamber 22 that is positioned side-by-side with a battery 26 (such that the heating chamber 22 and the battery 26 extend along parallel directions and the battery 26 is laterally offset relative to the heating chamber 22) so as to minimize the overall volume of the device 20.

In both of these aerosol generating devices 10, 20 the thermoelectrical cell 13, 23 is configured to convert electrical power into a temperature gradient, transferring heat between two opposed surfaces 13a & 13b, 23a & 23b when supplied with electrical power. Specifically the thermoelectrical cells 13, 23 each comprise an heat receiving surface 13a, 23a that absorbs or receives heat during operation and an heat emitting surface 13b, 23b that supplies or emits heat. The thermoelectrical cells 13, 23 are each arranged such that their heat emitting surface 13b, 23b form an internal surface of the cylindrical or tube shaped thermoelectrical cells 12, 23, whereas the heat receiving surface 13a, 23a is positioned at an outer surface of the thermoelectrical cell.

In the aerosol generating device 10 of FIGS. 1a and 1b the heat emitting surface 13b defines the boundary of the heating chamber 12—i.e. such that the heat emitting surface 13b forms a cylindrical wall of the heating chamber 12. The heater 14 of this first aerosol generating device 10 is provided at the closed end 12b of the heating chamber 12.

In the aerosol generating device 20 of FIG. 2, the heater 24 is cylindrical and provided between the thermoelectrical cell 23 and the heating chamber 22. Thus the thermoelectrical cell 23 is provided concentrically around both the heating chamber 22 and the heater 24. As shown, the cylindrical thermoelectrical cell 23 surrounds the heating chamber 22, and conforms to the surface relief of the cylindrical heating chamber 22.

The arrangement of the heater 15, 25 shown in FIGS. 1a and 2 is not intrinsically related to the form of the respective aerosol generating device 10, 20. A pen-shaped aerosol generating device could be provided with a heater arranged concentrically around its heating chamber, whilst a carton-shaped aerosol generating device may be provided with a heater at one end of its heating chamber. Similarly, a thermoelectrical cell may be provided along only a portion of the length of the heating chamber and/or at an end of the heating chamber.

The aerosol generating devices 10, 20 of FIGS. 1a and 1b, and FIG. 2 are intended to operate in similar manners. First, an aerosol substrate is inserted into the heating chamber 12, 22 of the aerosol generating device 10, 20. Secondly the aerosol generating device 10, 20 is configured to heat the heating chamber 12, 22 to a temperature at which an aerosol is released from the aerosol substrate. To achieve this the control unit 15, 25 instructs the heater 14, 24 to heat the heating chamber 12, 22. Optionally, the control unit 15, 25 may also instruct the thermoelectrical cell 13, 23 to transfer heat from its heat receiving surface 13a, 23a to its heat emitting surface 13b, 23b, thereby transferring heat towards and into the heating chamber 12, 24 (via the heater 24 in the aerosol generating device of FIG. 2). For many types of aerosol substrate, the temperature of the heating chamber 12, 22 is raised to between 150 degrees and 350 degrees Celsius.

During use, the internal temperature of the heating chamber 12, 22 may be maintained at a predetermined temperature, or within a predetermined range of temperatures by the aerosol generating device 10, 20. Alternatively, the internal temperature may be varied—e.g. the internal temperature may be increased during or between uses to compensate for flavor depletion of an aerosol substrate. The dissipation or transfer of heat away from the hot heating chamber 12, 22 may be actively prevented or counteracted using the thermoelectrical cell 13, 23 (as opposed to the passive restriction of heat transfer provided by a layer of thermal insulation in conventional devices). The thermoelectrical cell 13, 23 is operated to transfer heat through itself towards the heating chamber 12, 22, so as to reduce or prevent the net flow of heat outwards from the heating chamber 12, 22 through the thermoelectrical cell 13, 23. Optionally, the heater 14, 24 may be operated to supply heat to the heating chamber 12, 22 to replace any heat that has dissipated from the heating chamber 12, 22. The operation of the thermoelectrical cell 13, 23 and/or the heater 14 24 is controlled or regulated by the control unit 15, 25. The control unit 15, 25 may controlled based on pre-determined (e.g. empirical) values, and/or based on temperature measurements of the heating chamber 12, 24, the thermoelectrical cell 13, 23, or the heater 14, 24, provided by one or more temperature sensors (not shown).

The control unit 15, 25 may apply a closed loop control scheme based on continuous or periodic temperature measurements from the temperature sensors. As such, the control unit 15, 25 may compare the measured temperature to a pre-determined desired temperature, and adjust the heat transferred by the thermoelectrical cell 13, 23 and/or the heat supplied by the heater 15, 25 so as to modify the temperature of the heating chamber 12, 22 based on the result of this comparison.

Optionally, the aerosol generating devices 10, 20 each comprise a cap (not shown) the cap being configured to selectively close the open end 12a, 22a of the respective heating chamber 12, 22. Such a cap may be configured to retain heat within the heating chamber 12, 22 and/or to prevent foreign objects from entering the heating chamber 12, 22 when not in use.

Further features of exemplary aerosol generating devices will now be discussed with reference to FIGS. 3 and 4. These figures show two further aerosol generating devices 30, 40 in schematic cross section along a plane that extends perpendicular to the direction in which their heating chambers 32, 42 extend. These aerosol generating devices 30, 40 are examples of devices that comprise a plurality of thermoelectrical cells.

Figure 3:
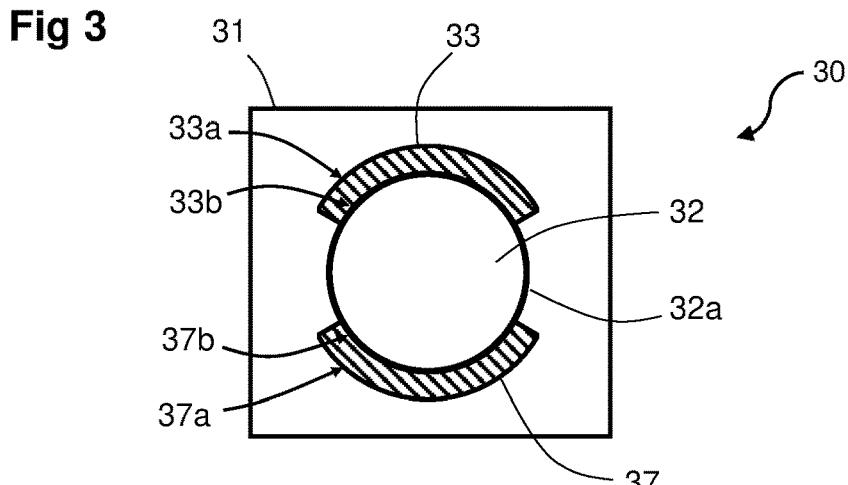
FIG. 3 shows a schematic cross section of a further aerosol generating device in accordance with the invention.

FIG. 3 shows an aerosol generating device 30 with a housing 41 having a rectangular cross section. The aerosol generating device 30 comprises a heating chamber 32 with a circular cross section, the heating chamber 32 comprising a circular outer wall 32a. The aerosol generating device 30 further comprises two thermoelectrical cells 33, 37. The thermoelectrical cells 33, 37 are arranged at opposing sides of the heating chamber 32, and each extends circumferentially around a portion of the heating chamber 32. Each thermoelectrical cell 33, 37 comprises a heat receiving surface 33a, 37a and an opposing heat emitting surface 33b, 37b. Each thermoelectrical cell 33, 37 is configured to transfer heat from the heat receiving surface 33a, 37a through to the heat emitting surface 33b, 37b and into the heating chamber 32 when said thermoelectrical cell 33, 37 receives electrical power. The heat emitting surface 33b, 37b of each thermoelectrical cell 33, 37 is formed in contact with the outer wall 32a of the heating chamber, and conforms to the circular shape of this outer wall 32a so as to maximize heat transfer from the respective thermoelectrical cell 33, 37 to the heating chamber 32.

Figure 4:
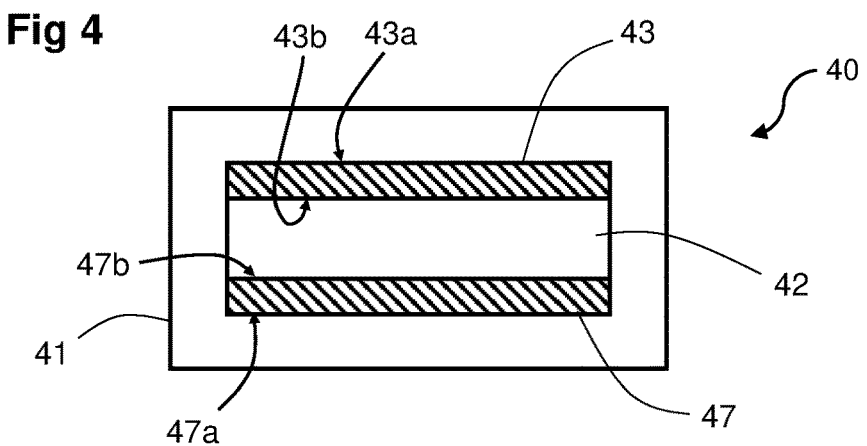
FIG. 4 shows a schematic cross section of a further aerosol generating device in accordance with the invention.

FIG. 4 shows a further aerosol generating device 40 that also has a rectangular cross section. The aerosol generating device 40 comprises a heating chamber 42 with a rectangular cross section. As such, the heating chamber 42 is well suited to receive aerosol substrates with a rectangular cross section, such as aerosol substrates in the form of a SIM card. The aerosol generating device 40 further comprises two thermoelectrical cells 43, 47 arranged on opposing sides of the heating chamber 42. Each thermoelectrical cell 43, 47 comprises a heat receiving surface 43a, 47a and an opposing heat emitting surface 43b, 47b. As shown, the heat emitting surfaces 43b 47b of the thermoelectrical cells 43, 47 form the opposing walls of the heating chamber 42 (i.e. such that the heat emitting surfaces 43b, 47b each define a boundary of the heating chamber 42). Each thermoelectrical cell 43, 47 is configured to transfer heat from the heat receiving surface 43a, 47a through to the heat emitting surface 43b, 47b and into the heating chamber 42 when said thermoelectrical cell 43, 47 receives electrical power. Thus the heat transferred through the thermoelectrical cell 43, 47 directly enters the heating chamber 42 of the aerosol generating device 40.

The aerosol generating devices 30, 40 shown in FIGS. 3 and 4 may additionally share any of the components, features, functions and advantages discussed with reference to the devices 10, 20 of FIGS. 1a, 1b and 2. For instance, in preferred implementations the aerosol generating devices 30, 40 further comprise at least a battery configured to supply electrical power to the thermoelectrical cells 33, 37, 43, 47 and a control unit configured to control the operation of the thermoelectrical cells 33, 37, 43, 47.

The aerosol generating devices 30, 40 shown in FIGS. 3 and 4 each comprise two thermoelectrical cells 33 & 37, 43 & 47 arranged at generally opposed sides of the respective heating chamber 32, 42. However, this is not essential and further aerosol generating devices may comprise a plurality of thermoelectrical cells arranged at different positions along the length of the heating chamber of the devices, or located at different locations around the perimeter of a heating chamber.

As will be appreciated from FIGS. 1 to 4, each of the aerosol generating devices 10, 20, 30, 40 does not comprise a layer of thermal insulation. Instead, the dissipation of heat from the is actively restricted by the thermoelectrical cells 13, 23, 33, 37, 43, 47 as discussed above. As such the aerosol generating devices 10, 20, 30, 40 discussed above are made particularly compact.

The invention claimed is:

1. An aerosol generating device comprising:

a heating chamber configured to receive a consumable aerosol generating substrate;

a heater configured to supply heat to the heating chamber; and a thermoelectric cell including a heat emitting surface extending along at least a portion of a perimeter of the heating chamber and facing inward toward the consumable aerosol generating substrate when the consumable aerosol generating substrate is received in the heating chamber, the thermoelectric cell having a first portion and a second portion spaced from one another along the perimeter of the heating chamber so as to define a gap between the first and second portions along the perimeter;

wherein the aerosol generating device is configured to supply electrical power to the thermoelectrical cell and the thermoelectric cell is arranged such that, when electrical power is supplied to the thermoelectric cell, heat is transferred through the thermoelectrical cell to the heating chamber by the thermoelectrical cell, and wherein the heater is spaced from the thermoelectric cell such that the heater is positioned along a different portion of the heating chamber than the thermoelectric cell and disposed at an axial end of the heating chamber along an axis.

2. The aerosol generating device according to claim 1, wherein the thermoelectric cell comprises a heat receiving surface and the heat emitting surface, and wherein, when electrical power is supplied to the thermoelectric cell, heat is transferred from the heat receiving surface to the heat emitting surface.

3. The aerosol generating device according to claim 2, wherein the heat emitting surface is arranged in contact with, or forms at least part of, a wall of the heating chamber.

4. The aerosol generating device according to claim 2, wherein the heat emitting surface conforms to a surface relief of a wall of the heating chamber.

5. The aerosol generating device according to claim 2, wherein the heating chamber is cylindrical.

6. The aerosol generating device according to claim 1, further comprising a control unit configured to regulate the heat transferred by the thermoelectrical cell so as to control an internal temperature of the heating chamber.

7. The aerosol generating device according to claim 6, wherein the control unit is configured to maintain the internal temperature of the heating chamber within a range of 150 to 350 degrees Celsius.

8. The aerosol generating device according to claim 6, wherein the control unit is configured to regulate the heat supplied to the heating chamber by the heater so as to control the internal temperature of the heating chamber.

9. The aerosol generating device according to claim 1, further comprising one or more temperature sensors, each temperature sensor being configured to measure one or more of: an internal temperature of the heating chamber, a temperature of a surface of the thermoelectrical cell, and a temperature of the heater.

10. The aerosol generating device according to claim 9, wherein the control unit is configured to receive a temperature measurement from at least one of the one or more temperature sensors, and wherein the control unit is further configured to regulate the internal temperature of the heating chamber based on said temperature measurement.

11. The aerosol generating device according to claim 1, further comprising a power source configured to supply the electrical power to the thermoelectric cell.

12. The aerosol generating device according to claim 6, wherein the control unit is configured to maintain the internal temperature of the heating chamber within a range of 190 to 310 degrees Celsius.

13. The aerosol generating device according to claim 6, wherein the control unit is configured to maintain the internal temperature of the heating chamber within a range of 230 to 260 degrees Celsius.

14. The aerosol generating device of claim 1, wherein the thermoelectric cell extends in an arcuate shape around the portion of the perimeter of the heating chamber.

15. The aerosol generating device of claim 1, wherein the thermoelectric cell extends linearly along the perimeter of the heating chamber.

16. A method of controlling the aerosol generating device according to claim 1, the method comprising the step of:

controlling the heat transferred through the thermoelectrical cell so as to regulate an internal temperature of the heating chamber.

* * * * *